United States Patent [19]

Rohr et al.

[11] Patent Number: 5,047,388
[45] Date of Patent: Sep. 10, 1991

[54] SUPERCONDUCTOR AND METHOD FOR ITS PRODUCTION

[75] Inventors: Franz-Josef Rohr, Absteinach; Andreas Reich, Heidelberg, both of Fed. Rep. of Germany

[73] Assignee: Asea Brown Boveri Aktiengesellschaft, Mannheim, Fed. Rep. of Germany

[21] Appl. No.: 290,520

[22] Filed: Dec. 27, 1988

[30] Foreign Application Priority Data

Dec. 24, 1987 [DE] Fed. Rep. of Germany ....... 3744145

[51] Int. Cl.$^5$ .................... H01L 39/12; C04B 35/48; C23C 4/10; H01B 12/00
[52] U.S. Cl. ........................................ 505/1; 505/739; 505/741; 427/62; 427/63; 427/226; 427/419.2; 427/419.3
[58] Field of Search .................. 423/598, 608; 427/62, 427/63, 34, 226, 419.2, 419.3, 126.3; 505/1, 701, 731, 737, 739, 741

[56] References Cited

U.S. PATENT DOCUMENTS

| 3,193,346 | 7/1965 | Klimaszewski | 423/608 |
| 3,245,757 | 4/1966 | Klimaszewski | 423/608 |
| 3,472,680 | 10/1969 | Barnes | 423/608 |
| 3,528,919 | 9/1970 | McNamara et al. | 423/598 |
| 3,879,625 | 4/1975 | McVey et al. | 427/106 |
| 4,061,583 | 12/1977 | Murata et al. | 423/598 |
| 4,347,650 | 9/1982 | McLarney et al. | 427/77 |
| 4,593,228 | 6/1986 | Albrechtson et al. | 427/66 |
| 4,774,150 | 9/1988 | Amano et al. | 427/157 |
| 4,844,951 | 7/1989 | Sarin et al. | 427/255 |
| 4,882,109 | 11/1989 | Matsui et al. | 427/34 |
| 4,882,312 | 11/1989 | Morgro-Camrero et al. | 505/1 |
| 4,897,378 | 1/1990 | Chiang | 505/1 |

OTHER PUBLICATIONS

Miura et al, *Applied Physics Letters*, vol. 53, No. 20, 14 Nov. 1988, pp. 1967–1969.
Lee et al, *American Vacuum Society Conf. on Thin Film Processing of Superconductors*, Nov. 1987, pp. 427–431.
Guarnieri et al, *AVS Conf. on Thin Film Processing of Superconductors*, Nov. 1987, pp. 204–210.

Primary Examiner—Shrive Beck
Assistant Examiner—Margaret Burke
Attorney, Agent, or Firm—Herbert L. Lerner; Laurence A. Greenberg

[57] ABSTRACT

A superconductor and a method of producing the same include a supporting substrate and a superconducting oxide ceramic material applied to the supporting substrate. At least one thermally and chemically stable intermediate layer is applied directly between the superconducting ceramic material and the substrate.

1 Claim, 1 Drawing Sheet

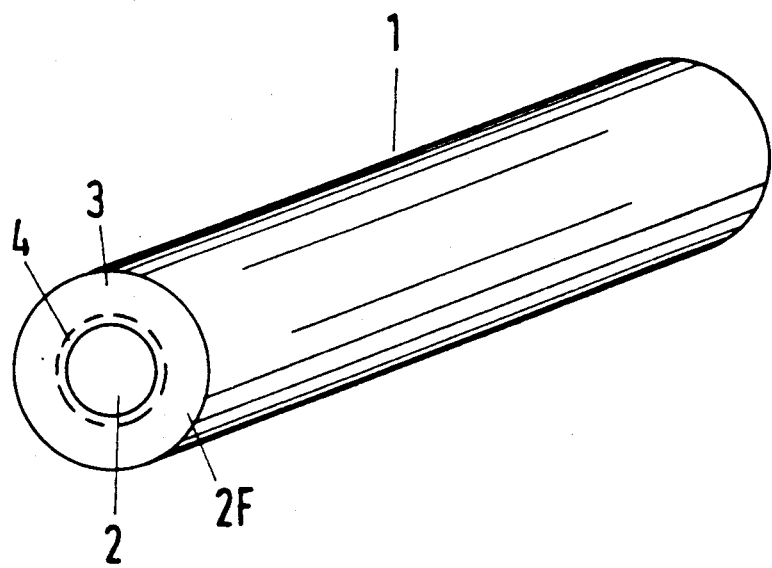

SUPERCONDUCTOR AND METHOD FOR ITS PRODUCTION

BACKGROUND OF THE INVENTION

1. Field of the Invention

The invention relates to a ceramic oxide superconductor element and more particularly to ceramic oxide superconductor crystals deposited on a supporting substrate.

2. Description of the Related Art

Superconductors are used above all in energy technology. They are needed for further development in the field of nuclear fusion, superconducting generators, and the building of strong-field magnets. Superconductors are preferably in the form of wires, fibers, ribbons, foils, tubes, bodies having a capillary structure, or bodies with a honeycomb structure, for instance in the form of plates. For a relatively long time, superconductors have been produced from metals of the D-metal series and from metals located at the beginning of the P row. Recently, it has also become possible to make superconductors of ceramic materials. These are oxide ceramic materials having a perovskite structure, which have superconducting properties. These oxide ceramic materials are applied on a metallic or nonmetallic supporting substrate, which has good strength and sufficient flexibility. Thus far, strontium titanate ($SrTiO_3$) was preferred for the production of the substrate.

In the production of these superconductors, the materials used must be subjected to heat treatments at high temperatures. Therefore it cannot be precluded that chemical reactions or interactions may occur between the material comprising the substrate and the superconducting layer.

SUMMARY OF THE INVENTION

It is accordingly an object of the invention to provide a superconductor and method for its production, which overcomes the hereinafore-mentioned disadvantages of the heretofore-known products and methods of this general type, and in which chemical reactions and interactions between the material of the substrate and the superconducting material are precluded both at high and at low temperatures.

With the foregoing and other objects in view there is provided, in accordance with the invention, a superconductor, comprising a supporting substrate, a superconducting oxide ceramic material applied to said supporting substrate, and at least one thermally and chemically stable intermediate layer applied directly between said superconducting ceramic material and said substrate.

In accordance with another feature of the invention, the intermediate layer is formed from a compound selected from the group consisting of a doped zirconium dioxide, a doped cerium oxide, a pure aluminum oxide, a combination of magnesium oxide and aluminum oxide, a combination of aluminum oxide and titanium oxide, a combination of aluminum oxide and chromium oxide, a mixed oxide of perovskite structure and mixtures thereof.

In accordance with a further feature of the invention, the zirconium dioxide is doped with yttrium and/or ytterbium and has the following formula:

$$(ZrO_2)_{1-x}(Y_2O_3)_x$$

or $$(ZrO_2)_{1-y-z}(Y_2O_3)_y(Yb_2O_3)_z$$

and x or y+z can assume the following values: $0.04 \leq x \leq 0.1$ or $0.04 \leq y+z \leq 0.1$.

In accordance with an added feature of the invention, the doped zirconium dioxide has the following preferred compositions:

$$(ZrO_2)_{0.92}(Y_2O_3)_{0.8}$$

or $$(ZrO_2)_{0.92}(Y_2O_3)_{0.04}(Yb_2O_3)_{0.04}$$

In accordance with an additional feature of the invention, the intermediate layer is formed of strontium titanate ($SrTiO_3$), barium titanate ($BaTiO_3$) or $La_{1-x}(M)_xCrO_3$, in which M stands for magnesium, calcium, strontium or barium and wherein said chromium component is replaceable entirely or in part by iron, nickel, cobalt or manganese.

With the objects of the invention in view, there is also provided a method for producing a superconductor, which comprises applying a superconducting layer from an oxide ceramic material to a supporting substrate with an intermediate layer, and applying or depositing the intermediate layer onto the surface of the substrate by plasma spraying from a solution, from a suspension, by sputtering, or from the gas phase.

In accordance with another mode of the invention, there is provided a method which comprises forming the intermediate layer by preparing a fine-grained powder from the intermediate layer material to be used, and applying the powder to the surface of the substrate by means of plasma spraying, using argon as the vehicle gas.

In accordance with a further mode of the invention, there is provided a method which comprises forming the intermediate layer by forming a solution from nitrate compounds selected from the group consisting of zirconium, yttrium and ytterbium nitrates, in an admixture of water and a lower alcohol, setting a concentration of the solution from 5 to 30 mol % of the salt, and applying the solution to the surface (2F) of the substrate (2) and thermally oxidatively decomposing the nitrate compounds thereon at a temperature of from about 850° C. to 950° C.

In accordance with an added mode of the invention, there is provided a method which comprises forming the intermediate layer by forming a solution from nitrate compounds selected from the group of nitrates consisting of aluminum, aluminum and titanium, aluminum and chromium, strontium and titanium, barium and titanium, lanthanum, strontium and chromium, lanthanum, magnesium and chromium, lanthanum, barium and chromium, or lanthanum, strontium and chromium nitrates, with water and a lower alcohol, setting the concentration of the nitrite solution from 5 to 30 mol %, and applying the solution to the surface of the substrate and thermally oxidatively decomposing the nitrate compounds thereon in an oxygen atmosphere at a temperature of from about 850° C. to 950° C.

In accordance with an additional mode of the invention, there is provided a method which comprises forming the intermediate layer by forming a suspension from fine-grained powder of the mixed oxides of zirconium and yttrium, or of zirconium and/or yttrium and ytterbium, and 50% by weight of ethanol as well as 2% by weight of a polyglycol, applying the suspension to the surface of the substrate to be coated by immersion, spraying, electrophoresis or painting, and durably bonding the suspension to the substrate by sintering at 950° C.

In accordance with yet another mode of the invention, there is provided a method which comprises forming the intermediate layer by forming suspension from oxide combinations selected from the group consisting of aluminum oxide, a combination of magnesium oxide and aluminum oxide, a combination of aluminum oxide and titanium oxide, an aluminum-chromium oxide combination or a mixed oxide of perovskite structure in an aqueous vehicle comprising 50% by weight of ethanol and 2% by weight of a polyglycol, applying the suspension by immersion, electrophoresis, spraying or painting of the surface of the substrate to be coated, or by electrophoresis, and durably bonding the suspension to the substrate by sintering at 950° C.

In accordance with yet a further mode of the invention, there is provided a method which comprises forming the intermediate layer by using $SrTiO_3$, $BaTiO_3$ or $La_{1-x}(M)_xCrO_3$ as the mixed oxide of perovskite structure, in which M stands for magnesium, calcium, strontium and barium, and wherein the chromium component can be replaced entirely or in part by iron, nickel, cobalt or manganese.

In accordance with a concomitant mode of the invention, there is provided a method which comprises forming the intermediate layer by depositing a compound selected from the group consisting of doped zirconium oxide, pure aluminum oxide, a combination of aluminum oxide and magnesium oxide, a combination of aluminum oxide and titanium oxide, a combination of aluminum oxide and chromium oxide, and a mixed oxide of perovskite structure from the gas phase onto the surface of the substrate to be coated, by using a CVD method, a PCVD method or an ECVD method.

According to the invention, the intermediate layer a material is used for forming that is not negatively affected by the prevailing conditions when the substrate is coated an during any aftertreatment. In particular, for the intermediate layer, materials are used which are substantially more stable thermally and chemically than the material of the substrate, or than the oxide material of the superconducting layer. For forming the intermediate layer, preferably oxides or mixed oxides based on zirconium, aluminum, magnesium, cerium, titanium or chromium or mixed oxides of perovskite structure are used, which are of suitable purity or are purposefully doped to be thermally and chemically stable up to temperatures of 1500° C. If zirconium dioxide is used to form the intermediate layer, then it is preferably doped with yttrium oxide and/or yttrium oxide and ytterbium oxide. With these doping agents, the crystal lattice of the zirconium dioxide is stabilized. The proportion of doping agent is from 4 to 8 mol % of the intermediate layer. It is also possible to dope zirconium dioxide with magnesium oxide. If the intermediate layer is formed from aluminum oxide, then either aluminum oxide is used in pure form, or in combination with magnesium oxide, titanium oxide or chromium oxide. For forming the intermediate layer, mixed oxides of perovskite structure can also be used in the form of $La_{1-}(M)_xCrO_3$. Here, M stands for magnesium, calcium, strontium and barium. The chromium (Cr) can be replaced entirely or in part by iron, nickel, cobalt or manganese. The intermediate layer can be applied by plasma spraying to the substrate. For this, a sprayable powder of the above-named materials, such as doped zirconium oxide powder, is prepared and deposited in a known manner with an inert gas such as argon as the vehicle gas. The formation of the intermediate layer can also take place by coating with the aid of a suspension, for which a fine-grained powder, for instance the doped zirconium dioxide powder, is prepared and mixed with an organic suspension agent (such as ethanol +a polyester wax). The deposition of the coating from the suspension can take place by immersion, spraying or electrophoresis. A solution, such as a salt solution or metal organic solutions of the starting substances, can also be used for forming the intermediate coating layer. The intermediate layer can also be applied by sputtering, using suitable targets, for instance of doped zirconium dioxide.

The intermediate layer can also be formed by deposition of the material used for its production from the gas phase. In particular, CVD (chemical vapor deposition), PCVD (plasma chemical vapor deposition) and ECVD (electrochemical vapor deposition) methods can be used. With the intermediate layer, a durable adhesion of the superconducting layer on the substrate is simultaneously effected.

Other features which are considered as characteristic for the invention are set forth in the appended claims.

Although the invention is illustrated and described herein as embodied in a superconductor and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

BRIEF DESCRIPTION OF THE DRAWING

The drawing is a diagrammatic perspective view of a superconductor according to the invention.

DESCRIPTION OF THE PREFERRED EMBODIMENTS

Referring now in detail to the single figure of the drawing, there is seen a superconductor 1, which is substantially formed of a substrate 2, an intermediate layer 3 and a superconducting layer 4. The substrate 2 is in the form of a fiber of cylindrical cross section. The substrate 2 may also be in the form of a ribbon or sheet. The substrate 2 is manufactured from a metal or metal alloy or from a non-metal material such as silicon carbide, silicon titanate, boron, steel, aluminum oxide or glass. To preclude chemical reactions between the material comprising the substrate 2 and the superconducting layer 4, the surface 2F of the substrate 2 is coated with an intermediate layer 3. The thickness of the intermediate layer 3 is between 1 μm and 100 μm, preferably 10 to 30 μm.

According to the invention, it can be formed by means of a doped zirconium dioxide. Preferably, zirconium oxide that is doped with yttrium oxide, and/or with yttrium oxide and ytterbium oxide, is used for this purpose, and has the following structural formula:

$$(ZrO_2)_{0.92}(Y_2O_3)_{0.8}$$

or

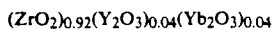

The intermediate layer can also be formed by aluminum oxide ($Al_2O_3$) in pure form. A combination of aluminum oxide and magnesium oxide is also possible for forming the intermediate layer. For forming the intermediate layer 3, a combination of aluminum oxide and titanium oxide ($Al_2O_3/TiO_2$) can also be used. Equally, the combination of aluminum oxide and chromium oxide ($Al_2O_3/Cr_2O_3$) is possible. Mixed oxides of perovskite structure can also be used for forming the intermediate layer. $SrTiO_3$, $BaTiO_3$ or $La_{1-x}(M)_xCrO_3$ are suitable for this. In the structural formula, M stands for magnesium, calcium, strontium or barium. With certain restrictions, depending on experimental trial, iron, nickel, cobalt or manganese can be used instead of the chromium in this formula.

For applying the intermediate layer, a powder of one of the above materials is prepared. This powder is applied by means of plasma spraying, using argon as the spray vehicle gas, directly onto the surface 2F of the substrate 2. For the plasma spraying, all the above named materials are suitable. The possibility also exists of preparing a solution, using nitrate compounds. The nitrate is mixed with water and/or alcohol, and a solution is prepared having a concentration of from 5 to 30 mol %. This solution can then be sprayed into the surface 2F of the substrate. The solution is applied in a quantity such that after a heat treatment, the final intermediate layer has the desired thickness. For preparing the solution, nitrate compounds of zirconium, yttrium and ytterbium are used, if the intermediate layer is to comprise doped zirconium dioxide. Nitrate compounds of lanthanum, barium and chromium are used if the intermediate layer is to be formed by a mixed oxide of perovskite structure. The surface 2F of the substrate 2 can be dipped once or several times into the solution, or sprayed with the solution. During a heat treatment at a temperature between 850° C. and 950° C., the solvent is evaporated and the nitrate is thermally and oxidatively decomposed, so that under the influence of oxygen the desired intermediate layer forms. According to the invention, a suspension can also be used to form the intermediate layer 3. The suspension is prepared from very fine-grained powder of the intermediate layer material comprising alcoholate or oxalate compounds of the starting substances or a mixed oxide of perovskite structure. For this purpose, alcoholates or oxalates that have zirconium and yttrium or aluminum and magnesium as the metal components are particularly suitable. For forming the suspension, preferably 50% by weight of ethanol and 2% by weight of polyglycol are mixed with the fine-grained powder. The surface 2F of the substrate 2 can be provided with the intermediate layer 3 by immersion into the suspension. Naturally, the possibility also exists of forming the intermediate layer by spraying or painting the suspension onto the surface 2F. The intermediate layer materials can also be precipitated from the suspension by electrophoresis. The quantity of the suspension applied is selected such that the intermediate layer 3 after completion of heat treatment has the desired thickness. After the application of the suspension, the coated substrate is subjected to a heat treatment at a temperature of from 800° to 950° C., in the course of which a durable bonding of the intermediate layer 3 to the substrate 2 is attained and the suspension agent is evaporated.

It is likewise possible to form the intermediate layer 3 by sputtering, using a target of one of the described materials.

By depositing doped zirconium oxide, pure aluminum oxide or a combination of aluminum oxide and magnesium oxide, or aluminum oxide and titanium oxide, or aluminum and chromium oxide, or a mixed oxide of perovskite structure, as described above, from the gas phase, the intermediate layer can also be formed. In particular, CVD, PCVD and ECVD methods can be used.

For improving the adhesion and compatibility of ceramic intermediate layers 3 with a substrate 2 that is produced from a metal or an alloy, an adhesion promoter layer (not shown here) of MCrAlY (M=Ni, Co, Fe) can be applied directly to the substrate 2 by plasma spraying. Once the intermediate layer has been applied as a coating to the surface 2F of the substrate 2, the superconducting layer 4 is deposited on it. With intermediate layers 3 of zirconium oxide, the oxygen transport through the zirconium oxide layer can be utilized in order to establish an optimal oxygen stoichiometry in the superconducting layer 4. For this purpose, after the superconducting layer 4 has been deposited, a direct voltage is applied between the electrically conductive, gas-permeable substrate 2 and the superconducting layer 4, which substantially increases the permeation of the oxygen through the zirconium oxide layer.

The superconducting layer itself is subjected to a additional aftertreatment with oxygen, in which the entire superconductor 1 is heated in air to from 850°C. to 950° C. and then slowly cooled down in an oxygen atmosphere and tempered for 4 to 16 hours at from 400° to 500° C.

The foregoing is a description corresponding in substance to German Application P 37 44 145.0, dated Dec. 24, 1987, the International priority of which is being claimed for the instant application, and which is hereby made part of this application. Any material discrepancies between the foregoing specification and the aforementioned corresponding German application are to be resolved in favor of the latter.

We claim:

1. A method for producing a superconductor which comprises applying a layer of superconducting oxide ceramic material to a supporting substrate with an intermediate layer coating which coating is formed by the steps of forming a suspension of $La_{1-x}M_xCrO_3$ in which M is selected from the group consisting of magnesium, calcium, strontium, and barium, and wherein the chromium component can be replaced entirely or in part by iron, nickel, cobalt, or manganese;

applying said suspension by the steps of immersion, electrophoresis, spraying, or painting onto the surface of a substrate to be coated, and then durably bonding the suspension to the substrate by sintering at substantially 950° C. to form said coated substrate layer.

* * * * *